(12) United States Patent
Yoshikawa et al.

(10) Patent No.: US 8,558,342 B2
(45) Date of Patent: Oct. 15, 2013

(54) SEMICONDUCTOR DEVICE

(75) Inventors: Koh Yoshikawa, Nagano (JP); Motoyoshi Kubouchi, Nagano (JP)

(73) Assignee: Fuji Electric Co., Ltd. (JP)

( * ) Notice: Subject to any disclaimer, the term of this patent is extended or adjusted under 35 U.S.C. 154(b) by 386 days.

(21) Appl. No.: 12/892,676

(22) Filed: Sep. 28, 2010

(65) Prior Publication Data

US 2011/0073903 A1    Mar. 31, 2011

(30) Foreign Application Priority Data

Sep. 29, 2009   (JP) ................................. 2009-225617

(51) Int. Cl.
  *H01L 29/02*    (2006.01)
(52) U.S. Cl.
  USPC ............. 257/488; 257/E29.009; 257/E29.197
(58) Field of Classification Search
  None
  See application file for complete search history.

(56) References Cited

U.S. PATENT DOCUMENTS

| 5,548,150 A | * | 8/1996 | Omura et al. ................. 257/349 |
| 5,898,199 A | * | 4/1999 | Mori et al. ..................... 257/328 |
| 7,732,821 B2 | * | 6/2010 | Suzuki et al. .................... 257/77 |
| 2009/0194786 A1 | | 8/2009 | Iwamoto et al. |

FOREIGN PATENT DOCUMENTS

| JP | 08-088346 A | 4/1996 |
| JP | 2005-101254 A | 4/2005 |
| JP | 2005-252212 A | 9/2005 |
| JP | 2009-187994 A | 8/2009 |

* cited by examiner

*Primary Examiner* — Benjamin Sandvik
*Assistant Examiner* — Leslie Pilar Cruz
(74) *Attorney, Agent, or Firm* — Rossi, Kimms & McDowell LLP

(57) ABSTRACT

A reverse blocking IGBT according to the invention can include a reverse breakdown withstanding region, p-type outer field limiting rings formed in a reverse breakdown withstanding region and an outer field plate connected to the outer field limiting rings, the outer field plate including a first outer field plate in contact with outer field limiting rings nearest to the active region and second outer field plates in contact with other outer field limiting rings. The first outer field plate having an active region side edge portion projecting toward the active region and second outer field plate having an edge area side edge portion projecting toward the edge area. The reverse blocking IGBT according to the invention can facilitate improving the withstand voltages thereof and reducing the area thereof.

7 Claims, 10 Drawing Sheets

SEMICONDUCTOR DEVICE

BACKGROUND OF THE INVENTION

A. Field of the Invention

The present invention relates to semiconductor devices.

B. Description of the Related Art

In the field of electric power converters using a semiconductor device, matrix converters have been known to the persons skilled in the art as direct converter circuits which conduct an alternating current to alternating current conversion (hereinafter referred to an "AC/AC conversion"), an alternating current to direct current conversion (hereinafter referred to an "AC/DC conversion") and a direct current to alternating current conversion (hereinafter referred to as a "DC/AC conversion").

The matrix converter includes AC switches. Since an AC voltage is applied to the AC switches, it is required for the AC switches to exhibit withstand voltages in the forward and reverse directions. In other words, the AC switches are required to exhibit a forward withstand voltage and a reverse withstand voltage. From the view points of reducing the size, weight and costs of the matrix converter and improving the conversion efficiency and response speed thereof, bidirectional switching apparatuses have been attracting much attention. As one of the bidirectional switching apparatuses, a switch including two reverse blocking insulated gate bipolar transistors (hereinafter referred to as "reverse blocking IGBTs") connected in parallel to each other has been known to the persons skilled in the art.

FIG. 10 is the cross sectional view of a conventional reverse blocking IGBT. In the following descriptions and the accompanied drawings, electrons or holes are the majority carries in the layers and regions prefixed with "n-type" or "p-type".

Referring now to FIG. 10, separation section 210 is formed in the edge area of an n-type semiconductor substrate in the reverse blocking IGBT for separating the crystal defects, caused in the side plane of the semiconductor substrate by dicing the semiconductor substrate into chips, from active region 100. In active region 100, a vertical IGBT, including n-type drift region 1, p-type channel region 2, n-type emitter region 3, and p-type collector region 10, is formed. In separation section 210, separation region 211 is formed through the semiconductor substrate from the substrate front surface to the substrate back surface such that separation region 211 covers the substrate side plane. Separation region 211 is connected to collector region 10 formed on the active region 100 back surface.

By disposing separation region 211 as described above, a depletion layer expands along separation region 211 from collector region 10 on the substrate back surface, when a reverse voltage is applied. Therefore, the depletion layer is prevented from reaching the substrate side plane and a leakage current is prevented from causing in the reverse blocking IGBT as shown in FIG. 10. Therefore, it is possible to provide the reverse blocking IGBT with a reverse withstand voltage. Between separation region 211 and active region 100, breakdown-withstanding junction edge-termination region (hereinafter referred to simply as "breakdown withstanding region") 200 is formed. Breakdown withstanding region 200 relaxes the electric field on the pn-junction constituting the semiconductor device and realizes the desired withstand voltages.

FIG. 11 is a cross sectional view showing active region 100 in the semiconductor device in detail.

In active region 100, p-type channel region 2 is formed selectively in the surface portion on the front side of drift region 1 constituting an n-type semiconductor substrate. In the channel region 2 surface portion, n-type emitter region 3 and p-type body region 4 are formed selectively. Above drift region 1, gate electrode 7 is formed with gate insulator film 6 interposed between drift region 1 and gate electrode 7. On gate electrode 7, interlayer insulator film 8 is formed. Emitter electrode 9 is formed such that emitter electrode 9 is in contact with emitter region 3 and body region 4. Emitter electrode 9 is insulated from gate electrode 7 by interlayer insulator film 8. On the back surface side of drift region 1, p-type collector region 10 and collector electrode 11 are formed.

FIG. 12 is a cross sectional view showing breakdown-withstanding junction edge-termination region 200 in the semiconductor device in detail.

In breakdown-withstanding junction edge-termination region (hereinafter referred to simply as "breakdown withstanding region") 200, a plurality of field limiting rings (hereinafter referred to as "FLRs") 201, which are floating p-type regions, is formed in the surface portion on the drift region 1 front side. The drift region 1 front surface, under which FLR 201 is not formed, is covered with interlayer insulator film 8. On interlayer insulator film 8, field plate (hereinafter referred to as "FP") 202, that is a floating electrically conductive film, is formed. FP 202 is in contact with and connected electrically to FLR 201. In the substrate edge area, field plate 212 having the potential the same with the separation region 211 potential (hereinafter referred to as "equipotential FP 212") is formed on interlayer insulator film 8. Equipotential FP 211 is in contact with and connected electrically to separation region 212.

Breakdown withstanding region 200 includes a region (hereinafter referred to as a "forward breakdown withstanding region") that improves mainly the forward withstand voltage, when a voltage is applied in the forward direction, and a region (hereinafter referred to as a "reverse breakdown withstanding region") that improves mainly the reverse withstand voltage, when a voltage is applied in the reverse direction. Although not illustrated in FIG. 12, the forward breakdown withstanding region is formed on the active region 100 side in breakdown withstanding region 200. The reverse breakdown withstanding region is formed on the edge area side in breakdown withstanding region 200. In addition to the forward and reverse breakdown withstanding regions, a plurality of FLRs 201 described above and a plurality of FPs 202 described above are formed.

FIG. 13 is a cross sectional view showing the forward breakdown withstanding region in the semiconductor device in detail.

In breakdown withstanding region 200, p-type channel stopper region 231 is formed between forward breakdown withstanding region 220 and reverse breakdown withstanding region 240. Field plate 232 (hereinafter referred to as middle FP 232") is connected electrically to channel stopper region 231. Forward breakdown withstanding region 220 is formed between active region 100 and middle FP 232. In forward breakdown withstanding region 220, field plate 222 (hereinafter referred to as "inner FP 222") connected electrically to field limiting ring 221 (hereinafter referred to as "inner FLR 221") is formed such that inner FP 222 projects toward the edge area of breakdown withstanding region 200.

FIG. 14 is a cross sectional view showing the reverse breakdown withstanding region in the semiconductor device in detail.

Reverse breakdown withstanding region 240 is formed from middle FP 232 to the edge area side of breakdown withstanding region 200. In reverse breakdown withstanding region 240, field plate 242 (hereinafter referred to as "outer FP 242") connected electrically to field limiting ring 241 (hereinafter referred to as "outer FLR 241") is formed such that outer FP 242 projects toward active region 100.

The following Patent Document 1 proposes a planar-type semiconductor device exhibiting a high withstand voltage as the reverse blocking IGBT described above. The proposed semiconductor device includes a semiconductor substrate of a first conductivity type; a separation diffusion region of a second conductivity type extended from the first major surface of the semiconductor substrate to the second major surface thereof; a base region of the second conductivity type including a planar junction and formed on the first major surface side of the semiconductor substrate surrounded by the separation diffusion regions; a junction edge-termination structure formed between the base region and the separation diffusion region; and a collector layer of the second conductivity type formed on the second major surface side of the semiconductor substrate and connected to the separation diffusion region. In the proposed semiconductor device, the junction edge-termination structure includes a ring-shaped floating guard ring of the second conductivity type formed in the peripheral surface portion around the base region with a spacing left between the adjacent floating guard rings; a field insulator film formed on the substrate surface between the separation diffusion region and the guard ring; a field insulator film formed on the substrate surface between the guard rings; a field insulator film formed on the substrate surface between the guard ring and the base region; an electrically conductive field plate in electrical contact with the separation diffusion region; an electrically conductive field plate in electrical contact with the guard ring; and an electrically conductive field plate in electrical contact with the base region. The electrically conductive field plate projects outward at least on the innermost field insulator film and the adjacent field insulator film. The electrically conductive field plate projects inward least on the outermost field insulator film and the adjacent field insulator film.

The following Patent Document 2 proposes another reverse blocking semiconductor device. The reverse blocking semiconductor device proposed in the following Patent Document 2 includes a base region of a second conductivity type formed selectively in the surface portion of a drift layer of a first conductivity type; an emitter region of the first conductivity type formed selectively in the surface portion of the base region; a MOS gate structure including a gate insulator film coated on the base region surface between the drift layer and the emitter region and a gate electrode coated above the base region with the gate insulator film interposed between the gate electrode and the base region; an emitter electrode in contact with the emitter region and the base region; a separation region of the second conductivity type formed such that the separation region is surrounding the MOS gate structure via the drift layer and connecting the front and back surfaces of the drift layer; a collector layer of the second conductivity type formed on the back surface of the drift layer and connected to the separation region exposed to the back surface of the drift layer; and a collector electrode in contact with the collector layer. The reverse blocking semiconductor device further includes a ring-shaped field limiting layer of the second conductivity type in the drift layer between the emitter electrode and the separation region; a ring-shaped field limiting electrode of a floating potential in contact with the field limiting layer; a plurality of the field limiting electrodes on the emitter electrode side having a large extended portion extended outward; and a plurality of the field limiting electrodes on the separation region side having a large extended portion extended inward.

The extensive and intensive investigations conducted by the present inventors have revealed the following points.

If outer FPs 242 connected electrically at least to outermost outer FLR 241 and adjacent outer FLR 241 in the reverse breakdown withstanding region are projected toward active region 100 as described in Japanese Unexamined Patent Application Publication No. 2005-101254 (hereinafter "Patent Document 1") and Japanese Unexamined Patent Application Publication No. 2005-252212 (hereinafter "Patent Document 2), the depletion layer extending from separation region 211 at a reverse voltage application will extend easily toward active region 100. Therefore, electric field localization will be caused in channel stopper region 231 that suppresses the depletion layer expansion and electric field strength rise may be caused therein. To obviate this problem, it is necessary to elongate the spacing between separation region 211 and channel stopper region 231 (the reverse breakdown withstanding region 240 width) as long as the length, for which the depletion layer is liable to additional extension. In other words, the breakdown withstanding region 200 length between active region 100 and separation region 211 (hereinafter referred to as the "breakdown withstanding region 200 width") will be elongated and the reverse blocking IGBT will be enlarged in the total size thereof. Therefore, it is difficult to reduce the reverse blocking IGBT area.

Generally, the upper limit of the current capability (the withstand voltages) is improved by disposing a breakdown-withstanding junction edge-termination region as compared with the elimination of the breakdown-withstanding junction edge-termination region. However, since the main current does not flow through the breakdown-withstanding junction edge-termination region, the current capability of the semiconductor device itself is not improved. Therefore, for reducing the reverse blocking IGBT area, it is preferable for breakdown withstanding region 200 to be small as much as possible in the size thereof.

In view of the foregoing, it would be desirable to obviate the problems described above. It would be also desirable to provide a semiconductor device that facilitates reducing the reverse blocking IGBT area. It would be further desirable to provide a semiconductor device that facilitates improving the withstand voltages thereof.

SUMMARY OF THE INVENTION

According to embodiments of the invention, there is provided a semiconductor device including: a semiconductor substrate including a first semiconductor region of a first conductivity type; an active region in the semiconductor substrate; a breakdown withstanding region outside the active region; and a collector region of a second conductivity type on the back surface of the semiconductor substrate.

The semiconductor device can also include a second semiconductor region of the second conductivity type in the peripheral area of the breakdown withstanding region, the second semiconductor region being formed through the semiconductor substrate from the front surface thereof to the back surface thereof, the second semiconductor region being in contact with the collector region; a third semiconductor region of the second conductivity type in the surface portion of the breakdown withstanding region on the front side of the semiconductor substrate, the third semiconductor region surrounding the active region; an interlayer insulator film formed selectively on the front surface of the semiconductor substrate; and an electrically conductive film in contact with the third semiconductor region, the electrically conductive film being on the interlayer insulator film.

The electrically conductive films, excluding at least the electrically conductive film in contact with the farthest third semiconductor region, which the depletion layer extending from the second semiconductor region toward the active region reaches, the farthest third semiconductor region being spaced apart most widely from the second semiconductor region, having the second semiconductor region side edge portion projecting farther toward the second semiconductor region than the second semiconductor region side edge portion of the third semiconductor regions in contact with the respective electrically conductive films.

The semiconductor device can further include a fourth semiconductor region of the second conductivity type in the surface portion of the breakdown withstanding region on the front side of the semiconductor substrate, the fourth semiconductor region suppressing the expansion of the depletion layer extending from the second semiconductor region toward the active region at the reverse voltage application; and the electrically conductive films, in contact with the third semiconductor regions between the second semiconductor region and the fourth semiconductor region and excluding at least the electrically conductive film in contact with the farthest third semiconductor region, which the depletion layer extending from the second semiconductor region toward the fourth semiconductor region reaches, the farthest third semiconductor region being spaced apart most widely from the second semiconductor region, having a second semiconductor region side edge portion projecting farther toward the second semiconductor region than the second semiconductor region side edge portion of the third semiconductor regions in contact with the respective electrically conductive films.

The number of the electrically conductive film can have the second semiconductor region side edge portion projecting farther toward the second semiconductor region than the second semiconductor region side edge portion of the third semiconductor region being larger than the number of electrically conductive film having a fourth semiconductor region side edge portion projecting farther toward the fourth semiconductor region than the fourth semiconductor region side edge portion of the third semiconductor region.

The number of the electrically conductive film can have the fourth semiconductor region side edge portion projecting farther toward the fourth semiconductor region than the fourth semiconductor region side edge portion of the third semiconductor region is 1.

The semiconductor substrate can be irradiated with an electron beam at the dose of 20 kGy or higher and treated thermally after lattice defects are introduced thereto.

The adjacent third semiconductor regions can be spaced apart more widely from each other as the third semiconductor regions are spaced apart more widely from the second semiconductor region.

According to embodiments of the invention, the electrically conductive films in contact with the third semiconductor regions are formed such that the electrically conductive films project toward the separation region excluding at least the electrically conductive film in contact with the farthest third semiconductor region, which the depletion layer extending from the second semiconductor region toward the active region reaches, the farthest third semiconductor region being spaced apart most widely from the second semiconductor region. By the electrically conductive film projection described above, the depletion layer expansion from the separation region toward the active region at the reverse voltage application is suppressed. Therefore, the depletion layer expanding from the separation region is prevented from extending too long and the electric field is prevented from rising in the vicinity of the fourth semiconductor region. By this scheme, it is possible to improve the reverse withstand voltage more effectively than by the conventional reverse blocking IGBT. It is also possible to shorten the reverse breakdown withstanding region by the width corresponding to the improvement on the reverse withstand voltage and, therefore, it is possible to shorten the breakdown withstanding region width as compared with the conventional reverse blocking IGBT. Therefore, it is possible to reduce the reverse blocking IGBT area.

The semiconductor device according to embodiments of the invention facilitates reducing the reverse blocking IGBT area. The semiconductor device according to embodiments of the invention also facilitates improving the withstand voltages thereof.

BRIEF DESCRIPTION OF THE DRAWINGS

The foregoing advantages and features of the invention will become apparent upon reference to the following detailed description and the accompanying drawings, brief descriptions of which follow.

DETAILED DESCRIPTION

Figure 1:
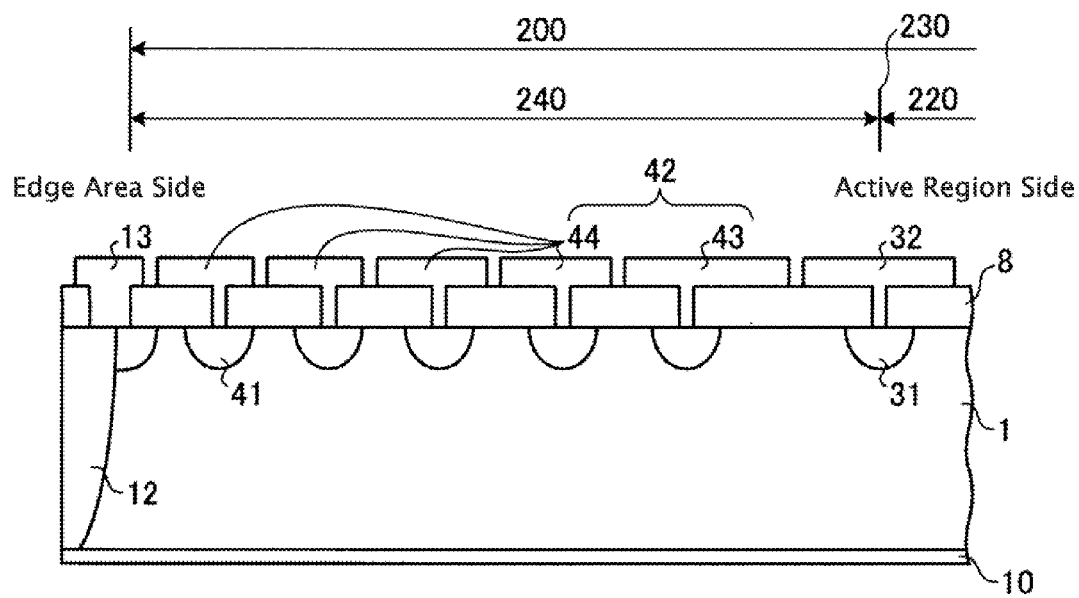
FIG. 1 is a cross sectional view showing the breakdown-withstanding junction edge-termination region in a reverse blocking IGBT according to a first embodiment of the invention.

Now the invention will be described in detail below with reference to the accompanied drawings which illustrate the preferred embodiments of the invention. In the following descriptions and the drawings which illustrate the preferred embodiments, the same reference numerals as used in FIGS. 10 through 14 are used to designate the same constituent elements and their duplicated descriptions are not made for the sake of simplicity.

(First Embodiment)

The reverse blocking insulated gate bipolar transistor (hereinafter referred to as the "reverse blocking IGBT") according to a first embodiment of the invention includes a semiconductor substrate including an n-type (a first conductivity type) drift region; an active region in the semiconductor substrate; a breakdown-withstanding junction edge-termination region (hereinafter referred to simply as a "breakdown withstanding region") outside the active region; and a p-type (a second conductivity type) separation region in the peripheral area of the breakdown withstanding region. In other words, the reverse blocking IGBT according to the first embodiment has a structure, in which the breakdown withstanding region is formed between an emitter region in the active region and the separation region. The breakdown withstanding region relaxes the electric field strength on a pn-junction constituting the semiconductor device and realizes a desired withstand voltages. The drift region corresponds to a first semiconductor region. The separation region corresponds to a second semiconductor region. The reverse blocking IGBT as described above exhibits a guaranteed withstand voltage of around 600 V or around 1200 V.

Figure 11:
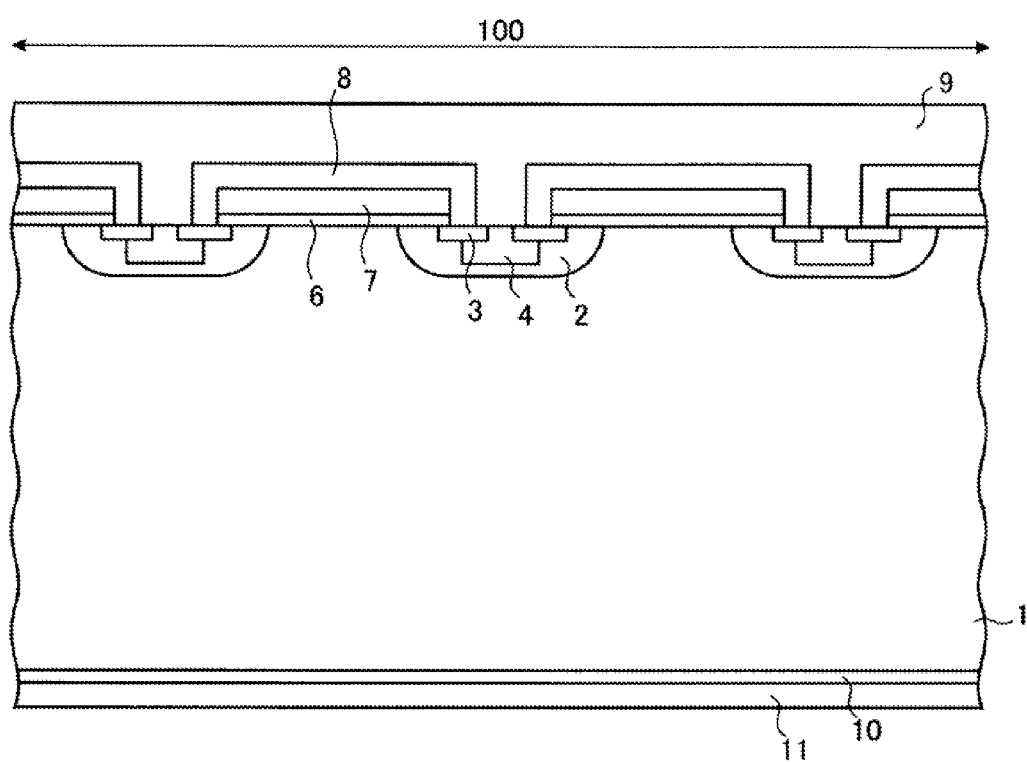
FIG. 11 is a cross sectional view showing the active region in the semiconductor device in detail.
Figure 12:
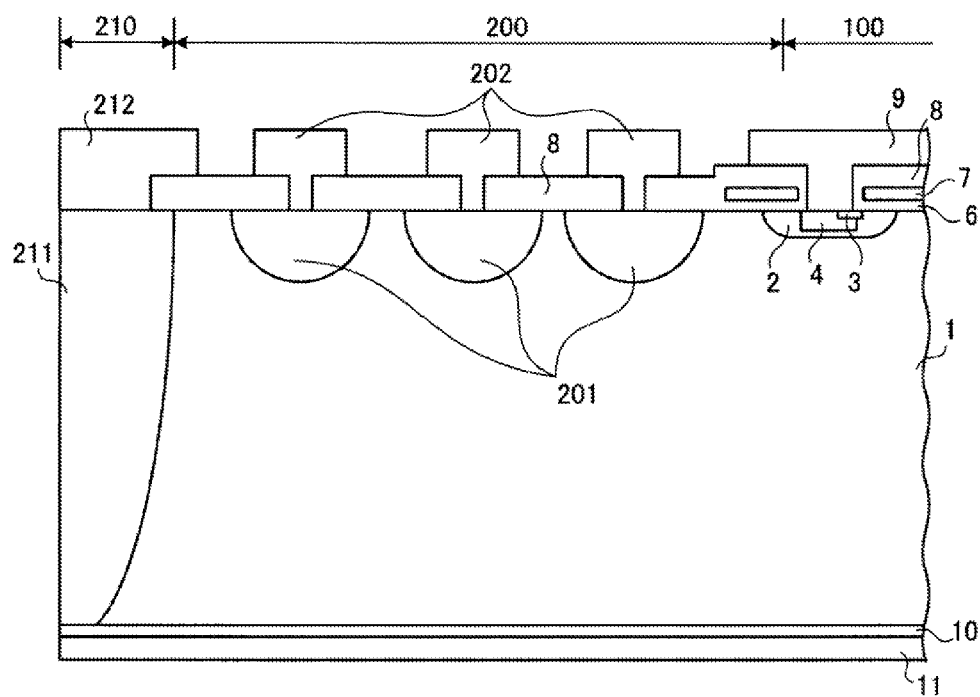
FIG. 12 is a cross sectional view showing the breakdown-withstanding junction edge-termination region in the semiconductor device in detail.
Figure 13:
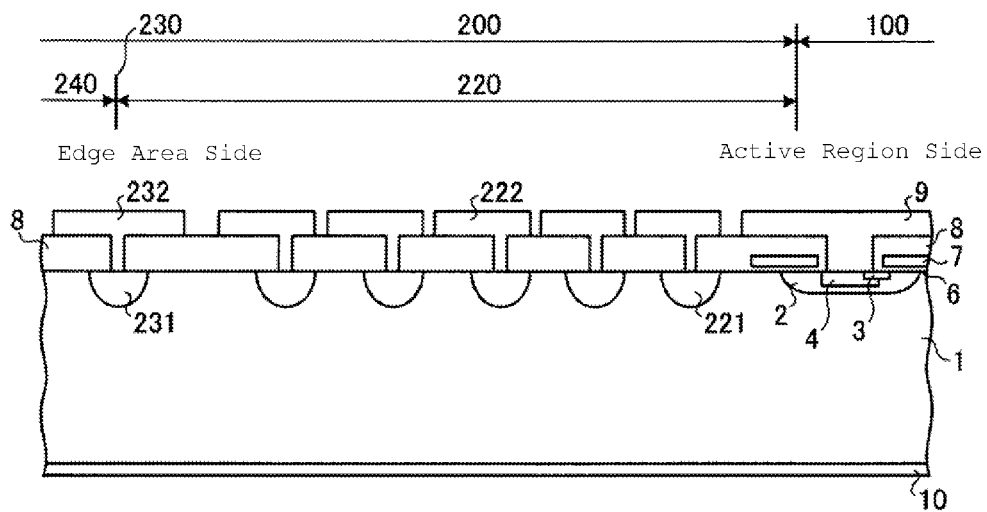
FIG. 13 is a cross sectional view showing the forward breakdown withstanding region in the semiconductor device in detail.
Figure 14:
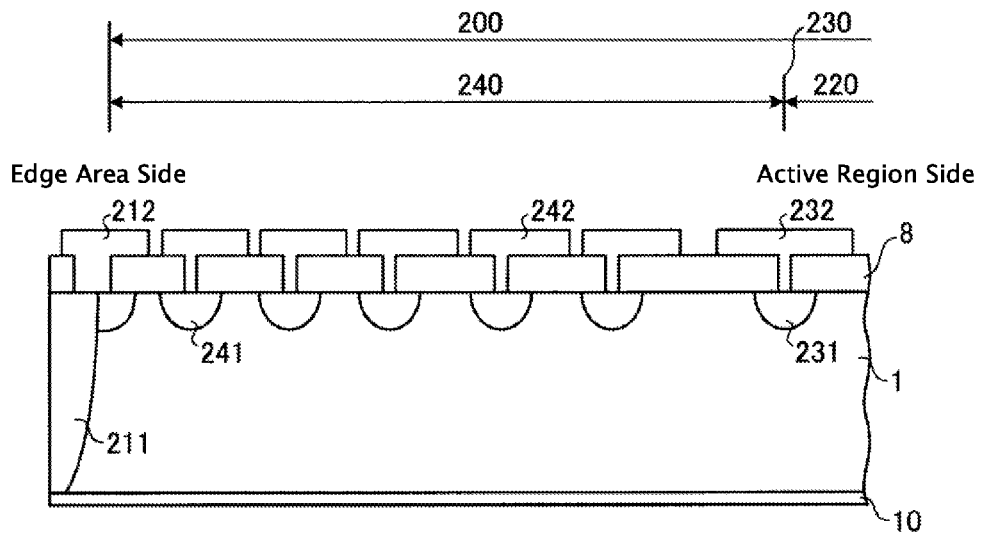
FIG. 14 is a cross sectional view showing the reverse breakdown withstanding region in the semiconductor device in detail.

In the active region, a p-type channel region is formed selectively in the surface portion on the front surface side of the drift region. In the surface portion of the channel region, an n-type emitter region and a p-type body region are formed selectively. A gate electrode is formed above the emitter region and the channel region and over the drift region with a gate insulator film interposed between the gate electrode and these regions. An emitter electrode is formed such that the emitter electrode is in contact with and connected electrically to the emitter region and the body region. The emitter electrode is insulated from the gate electrode by an interlayer insulator film. A collector region is formed on the back surface of the drift region. A collector electrode is formed on the collector region. In other words, a vertical IGBT as shown in FIG. 11 is formed in the active region.

The separation region is formed through the semiconductor substrate from the substrate front surface to the substrate back surface such that the separation region covers the substrate side plane. The separation region is connected to the collector region formed on the active region back surface. The separation region separates the crystal defects, caused in the substrate side plane by dicing the semiconductor substrate into chips, from the active region. By disposing the separation region as described above, a depletion layer extends along the separation region from the collector region on the substrate back surface, when a reverse voltage is applied. Therefore, the depletion layer is prevented from reaching the substrate side plane and a leakage current is prevented from causing. Therefore, it is possible to provide the reverse blocking IGBT with a reverse withstand voltage.

FIG. 1 is a cross sectional view showing the breakdown-withstanding junction edge-termination region in the reverse blocking IGBT according to the first embodiment of the invention.

As shown in FIG. 1, breakdown-withstanding junction edge-termination region (hereinafter referred to simply as "breakdown withstanding region") 200 includes a region (hereinafter referred to as a "forward breakdown withstanding region") 220 that improves mainly the forward withstand voltage, when a voltage is applied in the forward direction, and a region (hereinafter referred to as a "reverse breakdown withstanding region") 240 that improves mainly the reverse withstand voltage, when a voltage is applied in the reverse direction. In middle section 230 between forward breakdown withstanding region 220 and reverse breakdown withstanding region 240, p-type channel stopper region 31 is formed in the surface portion on the drift region 1 front side. The drift region 1 front surface, under which channel stopper region 31 is not, is covered with interlayer insulator film 8.

On interlayer insulator film 8 on channel stopper region 31, field plate (hereinafter referred to as "middle FP") 32 is formed. Middle FP 32 is in contact with and connected electrically to channel stopper region 31. The middle FP 32 edge portions project equally toward forward breakdown withstanding region 220 and toward reverse breakdown withstanding region 240. The projection implies that the FP edge portion is positioned more outward than the FLR edge portion on the same side of the FP. In other words, the FP edge portion is positioned not above the FLR, with which the FP is in contact, but above the drift region.

More in detail, the middle FP 32 edge portion on the forward breakdown withstanding region 220 side is positioned more closely to forward breakdown withstanding region 220 than the channel stopper 31 edge portion on the forward breakdown withstanding region 220 side. The middle FP 32 edge portion on the reverse breakdown withstanding region 240 side is positioned more closely to reverse breakdown withstanding region 240 than the channel stopper region 31 edge portion on the reverse breakdown withstanding region 240 side. Channel stopper region 31 corresponds to a fourth semiconductor region.

Middle FP 32 is fixed at a higher potential than the FP formed on the forward breakdown withstanding region 220 side of middle FP 32, when a depletion layer reaches middle FP 32 at a forward voltage application. The potential distribution makes it possible to suppress the further expansion of the depletion layer extending from forward breakdown withstanding region 220 to reverse breakdown withstanding region 240. Middle FP 32 is fixed at a higher potential than the FP formed on the reverse breakdown withstanding region 240 side of middle FP 32, when a depletion layer reaches middle FP 32 at a reverse voltage application. The potential distribution makes it possible to suppress the further expansion of the depletion layer extending from reverse breakdown withstanding region 240 to forward breakdown withstanding region 220. Therefore, it is possible to prevent a depletion layer from expanding over channel stopper region 31 while the semiconductor device is in the OFF-state thereof.

Forward breakdown withstanding region 220 is formed on the active region (not shown) side in breakdown withstanding region 200. Forward breakdown withstanding region 220 may have the structure the same with the forward breakdown withstanding region structure in the reverse blocking IGBT shown in FIG. 13 with no problem.

Reverse breakdown withstanding region 240 is formed on the edge area side in breakdown withstanding region 200. In reverse breakdown withstanding region 240, field limiting rings (hereinafter referred to as "outer FLRs") 41, which are floating p-type regions, are formed in the surface portions on the drift region 1 front side such that outer FLRs 41 are surrounding the active region. In other words, outer FLRs 41 are formed between channel stopper region 31 and separation region 12 such that outer FLRs 41 are surrounding channel stopper region 31 and spaced apart from channel stopper region 31. Adjacent outer FLRs 41 may be spaced apart more widely as outer FLRs 41 are positioned farther away from separation region 12. By disposing outer FLRs 41, the electric field in the corner portion on the pn-junction (hereinafter referred to as the "main junction") formed by the p-type channel region and the n-type drift region is relaxed. Outer FLR 41 corresponds to a third semiconductor region.

The drift region 1 front surface, under which any outer FLR 41 is not, is covered with interlayer insulator film 8. On interlayer insulator film 8 on outer FLR 41, field plate (hereinafter referred to "outer FP") 42 is formed. Outer FP 42 is in contact with and connected electrically to outer FLR 41. Outer FP 42 includes first outer FP 43 in contact with outer FLR 41 nearest to the active region and second outer FPs 44 in contact with respective outer FLRs 41 excluding outer FLR 41 nearest to the active region. Outer FLR 41 nearest to the active region is, for example, outer FLR 41 adjoining to channel stopper region 31 on the separation region 12 side thereof. By disposing outer FP 42, the electric field in the depletion layer edge portion in the vicinity of the main junction surface is relaxed. Outer FP 42 corresponds to an electrically conductive film.

First outer FP 43 is formed such that the edge portion thereof on the active region side projects toward the active region. In other words, the first outer FP 43 edge portion on the active region side is positioned more closely to the active region than the active region side edge portion of outer FLR 41, with which first outer FP 43 is in contact. Second outer FP 44 is formed such that the edge portion thereof on the separation region 12 side projects toward separation region 12. In other words, the second outer FP 44 edge portion on the separation region 12 side is positioned more closely to separation region 12 than the separation region 12 side edge portion of the outer FLR 41, with which second outer FP 44 is in contact.

First outer FP 43 may be formed such that first outer FP 43 is in contact with outer FLR 41, the farthest outer FLR from separation region 12, which the depletion layer extending at a reverse voltage application from separation region 12 toward the active region can reach. In this case, second outer FPs 44 may be formed on outer FLRs 41 formed on the separation region 12 side of outer FLR 41, with which first outer FP 43 is in contact. A first outer FP may be formed on the outer FLR formed on the active region side of outer FLR 41, with which first outer FP 43 is in contact. Alternatively, a PF may be formed on the outer FLR on the active region side of outer FLR 41, with which first outer FP 43 is in contact, such that the PF projects neither toward separation region 12 nor toward the active region.

A plurality of first outer FPs 43 may be formed with no problem. More in detail, first outer FPs 43 may be formed on outer FLR 41 nearest to the active region and on adjacent outer FLRs 41 on the separation region 12 side of outer FLR 41 nearest to the active region. In this case, second outer FPs 44 are formed on the other outer FLRs 41, on which any first outer FP 43 is not formed. It is preferable to dispose more second outer FPs 44 than first outer FPs 43.

In the edge area of the semiconductor substrate, field plate (hereinafter referred to as "equipotential FP") 13, the potential thereof is the same with the separation region 12 potential, is formed on interlayer insulator film 8. Equipotential FP 13 is in contact with and connected electrically to separation region 12. The equipotential FP 13 edge portion may be formed such that the equipotential FP 13 edge portion does not project toward the active region. By the equipotential FP 13 edge portion not projecting toward the active region, the depletion layer extending from separation region 12 toward the active region at a reverse voltage application is prevented from being liable to extension.

Figure 2:
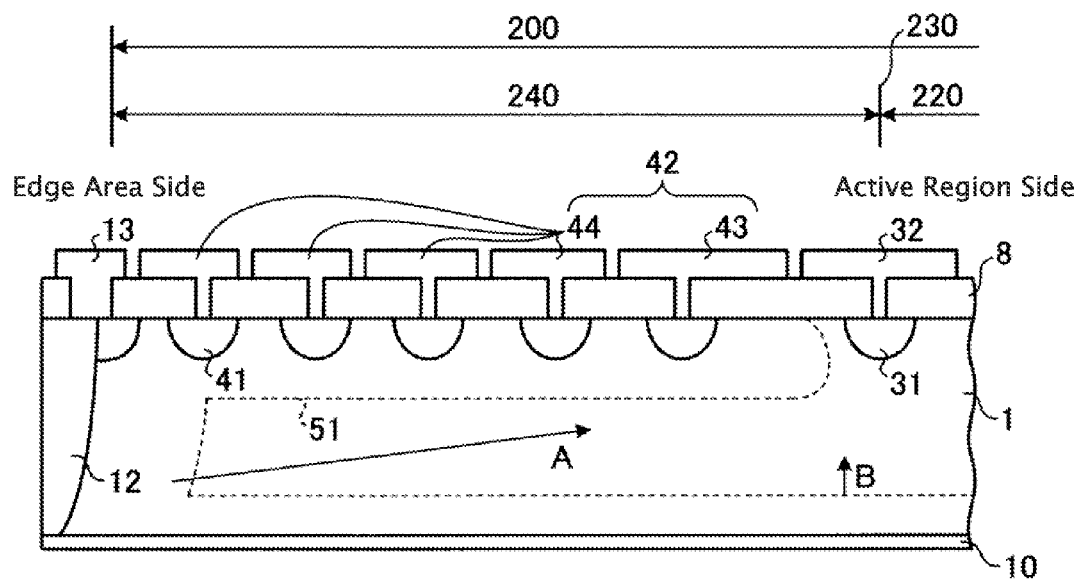
FIG. 2 is a cross sectional view illustrating the depletion layer extension at a reverse voltage application in the reverse blocking IGBT according to the first embodiment.

FIG. 2 is a cross sectional view illustrating the depletion layer extension at a reverse voltage application in the reverse blocking IGBT according to the first embodiment.

In reverse breakdown withstanding region 240, depletion layer 51 extends from separation region 12 at the reverse voltage application and expands along the drift region 1 surface in the direction indicated by the arrow A from separation region 12 to channel stopper region 31. When depletion layer 51 extending from separation region 12 reaches outer FLR 41 in contact with second outer FP 44, second outer FP 44 is fixed at a potential higher than the potentials of the FPs (including the equipotential FP) positioned on the separation region 12 side of second outer FP 44. Due to the potential distribution, depletion layer 51 is pushed back toward separation region 12 in drift region 1 below second outer FP 44. Thus, the depletion layer 51 extension is suppressed such that the depletion layer 51 extension is moderated as compared with the depletion layer extension from the separation region in the conventional reverse breakdown withstanding region. Therefore, it is possible to improve the reverse withstand voltage of the reverse blocking IGBT. The reason for this will be described later.

Depletion layer 51 extends also from collector region 10 and expands in the direction indicated by the arrow B from the drift region 1 back surface to the drift region 1 front surface. Since the majority carriers in drift region 1 decrease as depletion layer 51 extends also from collector region 10, the electric field strength is relaxed. Even if the depletion layer 51 extension from the separation region is suppressed by disposing second outer FP 44, it will be possible to prevent the electric field from localizing to the second outer FP 44 edge portion on the separation region 12 side and to make it hard for the breakdown caused by sharp electric field strength rise to occur.

Figure 3:
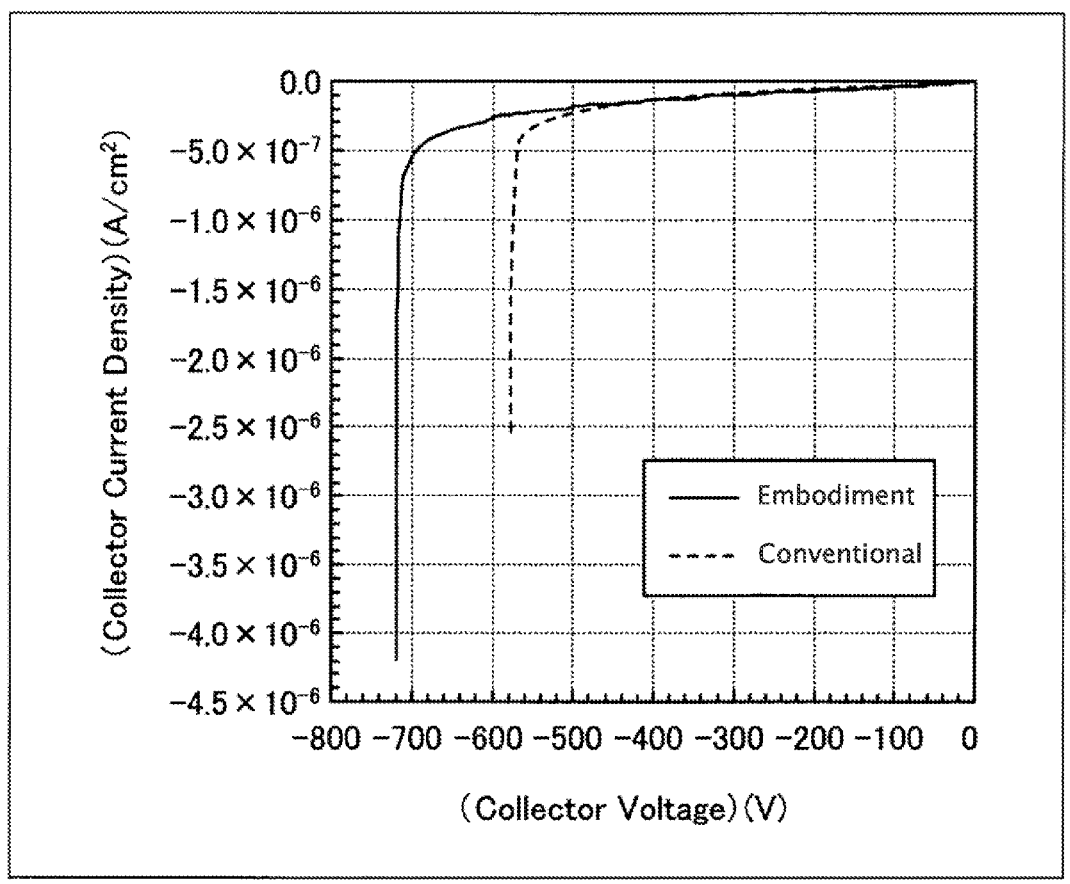
FIG. 3 is a couple of curves relating the collector current density with the collector voltage at a reverse voltage application in the reverse blocking IGBT according to the first embodiment and in the conventional reverse blocking IGBT.

Now the investigation results on the reverse withstand voltage of the reverse blocking IGBT according to the first embodiment will be described below. FIG. 3 is a couple of curves relating the collector current density with the collector voltage at the reverse voltage application for the reverse blocking IGBT according to the first embodiment and for the conventional reverse blocking IGBT.

A reverse blocking IGBT including the reverse breakdown withstanding region according to the first embodiment (cf. FIG. 1) is prepared. (Hereinafter, the prepared reverse blocking IGBT according to the first embodiment will be designated as "Embodiment".) For the sake of comparison, a reverse blocking IGBT including the conventional reverse breakdown withstanding region (cf. FIG. 14) is prepared. (Hereinafter, the prepared conventional reverse blocking IGBT will be designated as "Conventional".) The embodiment reverse blocking IGBT and the conventional reverse blocking IGBT are different from each other only in the outer FP 42 structure. The other structures are the same in the embodiment and conventional reverse blocking IGBTs. In other words, the embodiment reverse blocking IGBT includes outer FP 42 including first outer FP 43 and second FP 44. On the other hand, outermost outer FP 242 on the edge area side and outer FP 242 on the inner side of outermost outer FP 242 are formed such that these outer FPs 242 project toward the active region.

FIG. 3 indicates that the embodiment reverse blocking IGBT realizes a reverse withstand voltage of around 700 V. FIG. 3 indicates also that the conventional reverse blocking IGBT realizes a reverse withstand voltage of around 600V. Thus, the embodiment reverse blocking IGBT realizes a reverse withstand voltage higher than the reverse withstand voltage that the conventional reverse blocking IGBT exhibits. The reason for this is estimated as described below. In the conventional reverse blocking IGBT, outermost outer FP 242 on the edge area side and outer FP 242 on the inner side of outermost outer FP 242 project toward the active region. Therefore, the depletion layer extending from the separation region extends too long and the electric field strength in the channel stopper region rises in the conventional reverse blocking IGBT.

The breakdown-withstanding junction edge-termination region length between the active region and the separation region (hereinafter referred to as the "breakdown withstanding region width") is investigated for the embodiment and conventional reverse blocking IGBTs, the guaranteed withstand voltage thereof is set to be 600 V. The device simulation technique is employed in the investigation. The investigation results indicate that if the length between the active region and the separation region (hereinafter referred to as the "reverse blocking IGBT width") in the embodiment reverse blocking IGBT is set to be 1, the reverse blocking IGBT width in the conventional reverse blocking IGBT will be about 1.2. The results described above indicate that the embodiment reverse blocking IGBT facilitates improving the reverse withstand voltage and reducing the area thereof as compared with the conventional reverse blocking IGBT.

By disposing a first outer FP and a second outer FP in the reverse breakdown withstanding region as described above in connection with the first embodiment, it is possible to suppress the deletion layer extension from the separation region toward the active region at a reverse voltage application. Therefore, it is possible to prevent the depletion layer from extending too long from the separation region and to prevent the electric field strength from rising in the vicinity of the channel stopper region. Thus, it is possible for the reverse blocking IGBT according to the first embodiment to improve the reverse withstand voltage as compared with the conventional reverse blocking IGBT. It is possible for the reverse blocking IGBT according to the first embodiment to shorten the reverse breakdown withstanding region by the width corresponding to the improvement on the reverse withstand voltage and, therefore, to shorten the breakdown withstanding region width as compared with the conventional reverse blocking IGBT. Therefore, it is possible to reduce the reverse blocking IGBT area.

(Second Embodiment)

In the reverse blocking IGBT according to the first embodiment, a semiconductor substrate irradiated with an electron beam may be used. A thermal treatment may be conducted on the semiconductor substrate after the electron beam irradiation. The other structures are the same with the reverse blocking IGBT structures according to the first embodiment (cf. FIG. 1).

According to the second embodiment, an electron beam may be irradiated at the acceleration voltage of 4.8 MeV and at the dose of 20 kGy or higher to the semiconductor substrate used for manufacturing a reverse blocking IGBT. The electron beam irradiation may be conducted on the entire semiconductor substrate. By irradiating an electron beam to the entire semiconductor substrate, crystal defects (lattice defects) may be introduced intentionally into the semiconductor substrate. The thermal treatment after the electron beam irradiation may be conducted at 300 to 380° C. for around 1 hr. By conducting a thermal treatment after the electron beam irradiation, it is possible to reduce the specific resistance in the substrate surface portion. The reason for this will be described later. The reverse blocking IGBT according to the second embodiment has the structure the same with the reverse blocking IGBT structure according to the first embodiment. In detail, the reverse breakdown withstanding region in the breakdown withstanding region includes outer FP 42 including first outer FP 43 and second outer FP 44 (cf. FIG. 1). The reverse blocking IGBT as described above exhibits a guaranteed withstand voltage of around 1200V.

Figure 4:
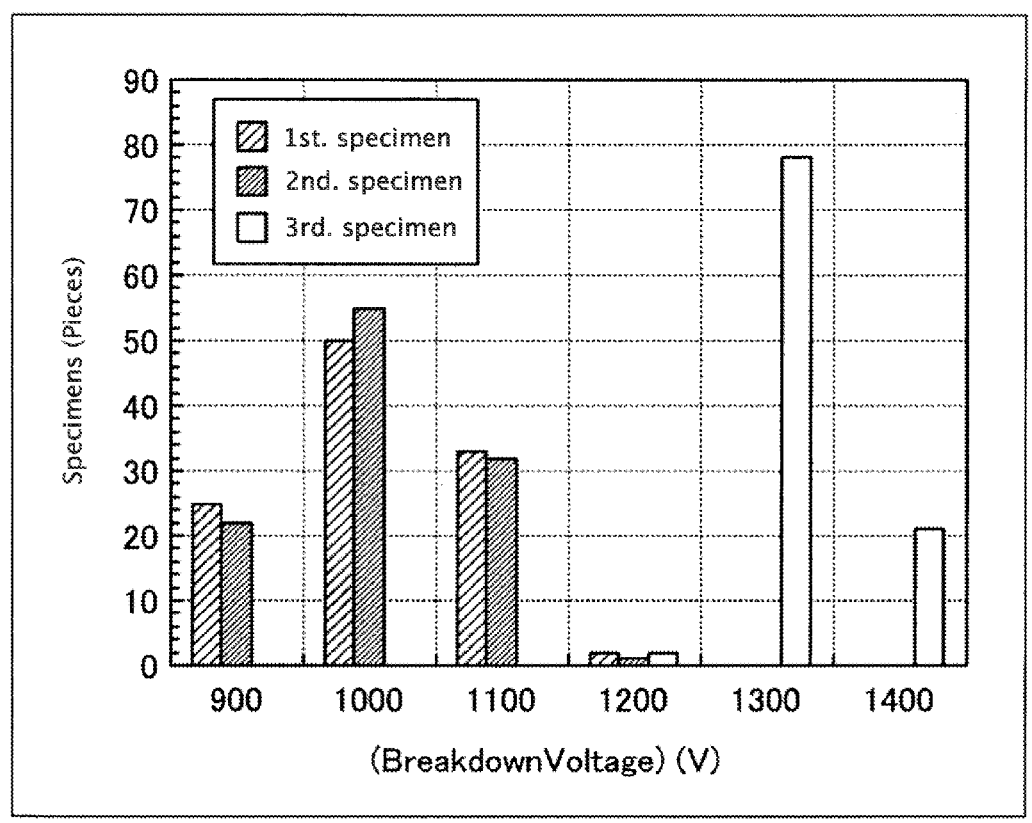
FIG. 4 is a graph describing the distribution of the reverse withstand voltages which the reverse blocking IGBT according to a second embodiment of the invention exhibits.

The reverse withstand voltage that the reverse blocking IGBT as described above exhibits is investigated. FIG. 4 is a graph describing the distribution of the reverse withstand voltages which the reverse blocking IGBT according to the second embodiment exhibits.

A reverse blocking IGBT fabricated using a semiconductor substrate not irradiated with any electron beam is prepared (hereinafter referred to as a "first specimen"). A reverse blocking IGBT fabricated using a semiconductor substrate irradiated with an electron beam is prepared (hereinafter referred to as a "second specimen"). A reverse blocking IGBT fabricated using a semiconductor substrate irradiated with an electron beam and thermally treated after the electron beam irradiation is prepared (hereinafter referred to as a "third specimen"). The electron beam is irradiated under the conditions including the acceleration voltage of 4.8 MeV and the dose of 20 kGy. The electron beam is irradiated to the entire semiconductor substrate. The thermal treatment after the electron beam irradiation is conducted at 330° C. for 1 hr. The first through third specimens have the reverse blocking IGBT structure according to the first embodiment. Multiple pieces of first through third specimens are prepared and the breakdown voltages are measured on the respective specimens to investigate the reverse withstand voltage distributions among the reverse blocking IGBT specimens. The vertical axis in FIG. 4 represents the specimen numbers for the first through third specimens at the measured breakdown voltages.

The results described in FIG. 4 indicate that the first specimen facilitates obtaining a reverse withstand voltage as high as 1200 V. The second specimen facilitates obtaining a reverse withstand voltage as high as 1200 V. The third specimen facilitates obtaining a reverse withstand voltage as high as 1400 V. The third specimen realizes a reverse withstand voltage 1.2 times as high as the reverse withstand voltage that the first and second specimens realize. The reason for this will be described below.

Figure 5:
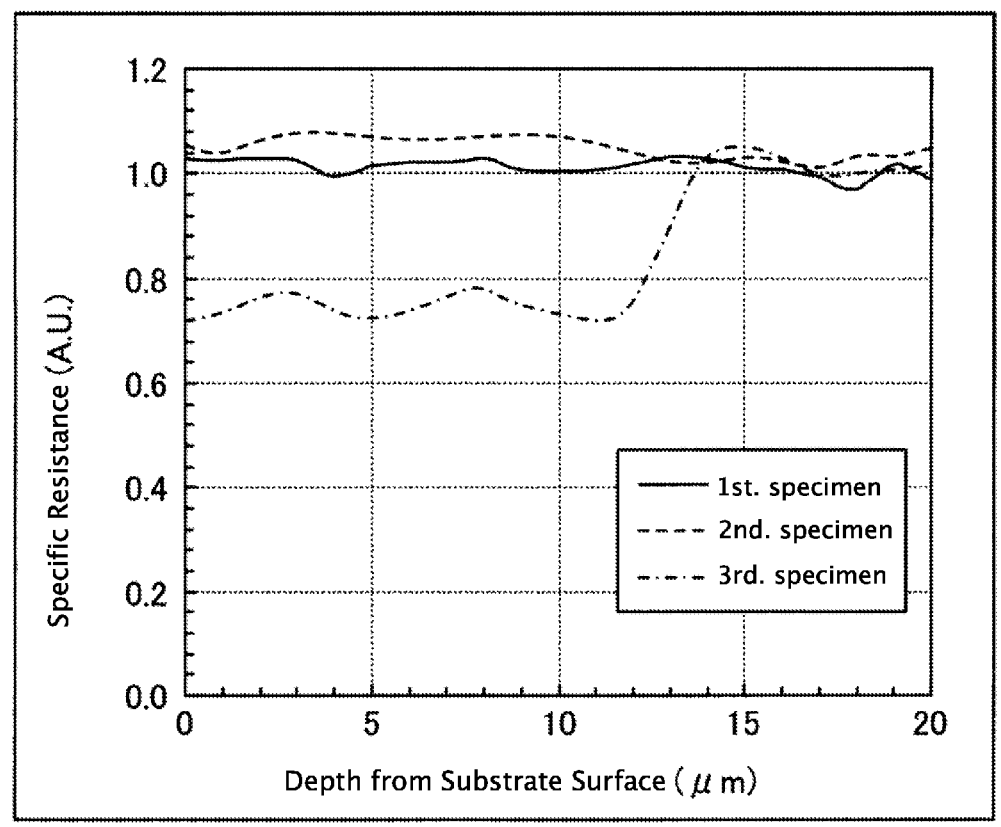
FIG. 5 is a set of curves relation the specific resistance with the depth from the substrate surface for the reverse blocking IGBT according to the second embodiment.

FIG. 5 is a set of curves relation the specific resistance with the depth from the substrate surface for the reverse blocking IGBT according to the second embodiment.

The specific resistance is measured on the first through third specimens from the substrate surface (0 μm) to the depth of 20 μm. The specific resistance is measured by a general spreading resistance measurement across the obliquely polished reverse breakdown withstanding regions in the respective specimens.

As the results described in FIG. 5 indicate, the specific resistance does not almost change from the substrate surface to the depth of 20 μm in the first and second specimens. On the other hand, the specific resistance lowers at the depth of 15 μm from the substrate surface in the third specimen. This result indicates that the third specimen facilitates expanding the depletion layer at the depth of 15 μm from the substrate surface and relaxing the electric field strength in the semiconductor substrate surface. Therefore, it is estimated that the reverse blocking IGBT, using a semiconductor substrate irradiated with an electron beam and thermally treated after the electron beam irradiation, facilitates improving the reverse withstand voltage more effectively than the reverse blocking IGBT using a semiconductor substrate not irradiated with any electron beam nor thermally treated.

As described above, the reverse blocking IGBT according to the second embodiment exhibits the effects the same with the effects, which the reverse blocking IGBT according to the first embodiment exhibits. By irradiating an electron beam to a semiconductor substrate for introducing lattice defects and by thermally treating the substrate according to the second embodiment, the specific resistance in the surface portion on the substrate front side is lowered. Since the electric field strength in the semiconductor substrate surface is relaxed, the reverse withstand voltage in the reverse breakdown withstanding region is improved as compared with by the reverse blocking IGBT that uses a semiconductor substrate not irradiated with any electron beam nor thermally treated. Therefore, it is possible for the reverse blocking IGBT according to the second embodiment to shorten the reverse breakdown withstanding region by the width corresponding to the improvement on the reverse withstand voltage and, therefore, to shorten the breakdown withstanding region width as compared with the reverse blocking IGBT that uses a semiconductor substrate not irradiated with any electron beam nor thermally treated. Thus, the reverse blocking IGBT according to the second embodiment facilitates reducing the area thereof.

(Third Embodiment)

Figure 6:
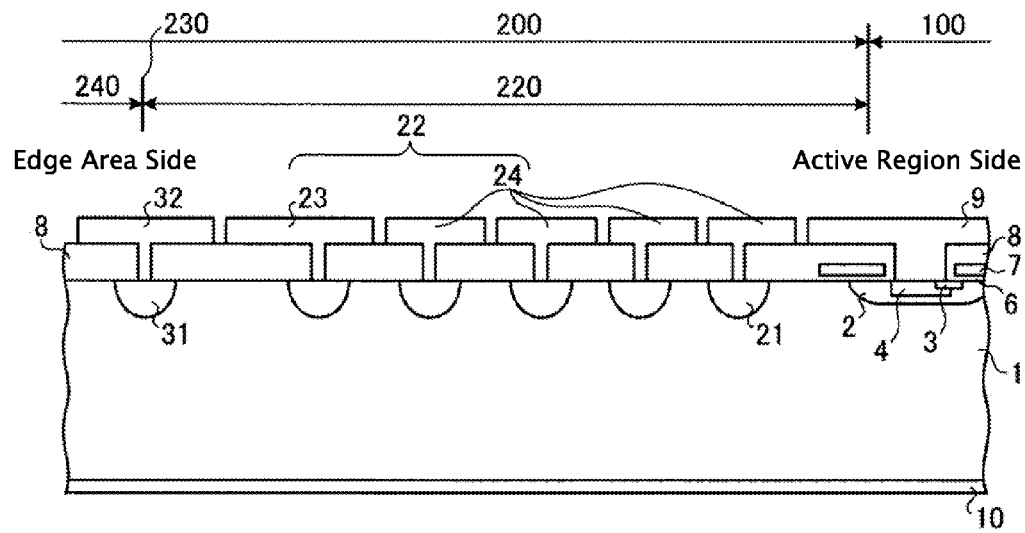
FIG. 6 is a cross sectional view showing the breakdown-withstanding junction edge-termination region in a reverse blocking IGBT according to a third embodiment of the invention.

FIG. 6 is a cross sectional view showing the breakdown-withstanding junction edge-termination region in a reverse blocking IGBT according to a third embodiment of the invention.

As shown in FIG. 6, the breakdown withstanding structure in the reverse breakdown withstanding region in the reverse blocking IGBT according to the first embodiment (cf. FIG. 1) may be applied to the forward breakdown withstanding region that obtains mainly a forward withstand voltage when a voltage is applied in the forward direction.

As shown in FIG. 6, forward breakdown withstanding region 220 is formed on the active region 100 side in breakdown-withstanding junction edge-termination region (hereinafter referred to simply as "breakdown withstanding region") 200. More in detail, in breakdown withstanding region 200, forward breakdown withstanding region 220 is formed between active region 100 and middle section 230 of reverse breakdown withstanding region 240 and forward breakdown withstanding region 220. In forward breakdown withstanding region 220, a plurality of field limiting ring (hereinafter referred to as "inner FLR) 21 that is a floating p-type region is formed in the surface portion on the drift region 1 front side such that inner FLRs 21 are surrounding active region 100.

In other words, inner FLRs 21 are formed between channel stopper region 31 and p-type channel region 2, formed in active region 100 and in adjacent to breakdown withstanding region 200, such that inner FLRs 21 are spaced apart from active region 100 and channel stopper region 31 and surrounding active region 100. Inner FLRs 21 may be formed such that adjacent inner FLRs 21 are spaced apart more widely from each other as inner FLRs 21 are spaced apart more widely from active region 100. The inner FLRs 21 disposition exhibits the effects the same with the effects that the outer FLRs 41 disposition according to the first embodiment exhibits.

The drift region 1 front surface, under which any inner FLR 21 is not formed, is covered with interlayer insulator film 8. Field plate (hereinafter referred to as "inner FP") 22 is formed on interlayer insulator film 8 on inner FLR 21. Inner FP 22 is in contact with and connected electrically to inner FLR 21. Inner FP 22 includes first inner FP 23 in contact with inner FLR 21 nearest to the edge area and second inner FPs 24 in contact with respective inner FLRs 21 excluding inner FLR 21 nearest to the edge area. Inner FLR 21 nearest to the edge area is inner FLR 21 in adjacent to channel stopper region 31 on the active region 100 side of the channel stopper region 31. The inner FP 22 disposition exhibits the effects the same with the effects, which the outer FP 42 disposition according to the first embodiment exhibits.

First inner FP 23 is formed such that the edge portion thereof on the edge area side projects toward the edge area. In other words, the first inner FP 23 edge portion on the edge area side is positioned more closely to the edge area than the edge area side edge portion of inner FLR 21, with which first inner FP 23 is in contact. On the other hand, second inner FP 24 is formed such that the edge portion thereof on the active region 100 side projects toward active region 100. In other words, the second inner FP 24 edge portion on the active region 100 side is positioned more closely to active region 100 than the active region 100 side edge portion of inner FLR 21, with which second inner FP 24 is in contact.

As described above, inner FP 22 is formed symmetrically to outer FP 42 in reverse breakdown withstanding region 240 according to the first embodiment with middle FP 32 as the center of symmetry. Alternatively, inner FP 22 may not be formed symmetrically to outer FP 42 in reverse breakdown withstanding region 240 according to the first embodiment with middle FP 32 as the center of symmetry with no problem.

Alternatively, first inner PF 23 may be formed such that first inner PF 23 is in contact with inner FLR 21, the farthest inner FLR from active region 100, which the depletion layer extending at a forward voltage application from active region 100 can reach. In this case, second FPs 24 are formed on inner FLRs 21 formed on the active region 100 side of inner FLR 21, with which first FP 23 is in contact. Still alternatively, a first inner FP may be formed on the inner FLR on the edge area side of inner FLR 21, with which first FP 23 is in contact. Further alternatively, a PF may be formed on the inner FLR on the edge area side of inner FLR 21, with which first FP 23 is in contact, such that the PF projects neither toward active region 100 nor toward the edge area.

A plurality of first inner FPs 23 may be formed. In other words, first inner FPs 23 may be formed on inner FLR 21 nearest to the edge area and on adjoining inner FLRs 21 on the active region 100 side. Second inner FPs 24 are formed on inner FLRs 21 not in contact with first FP 23. It is preferable to dispose more second inner FPs 24 than first inner FPs 23.

The reverse blocking IGBT according to the third embodiment may be manufactured employing a semiconductor substrate, into which lattice defects are introduced by electron beam irradiation and which is treated thermally after the electron beam irradiation in the same manner as according to the second embodiment. The reverse breakdown withstanding region structure in the reverse blocking IGBT according to the third embodiment may be the same with the reverse breakdown withstanding region structure in the reverse blocking IGBTs according to the first and second embodiments.

Figure 7:
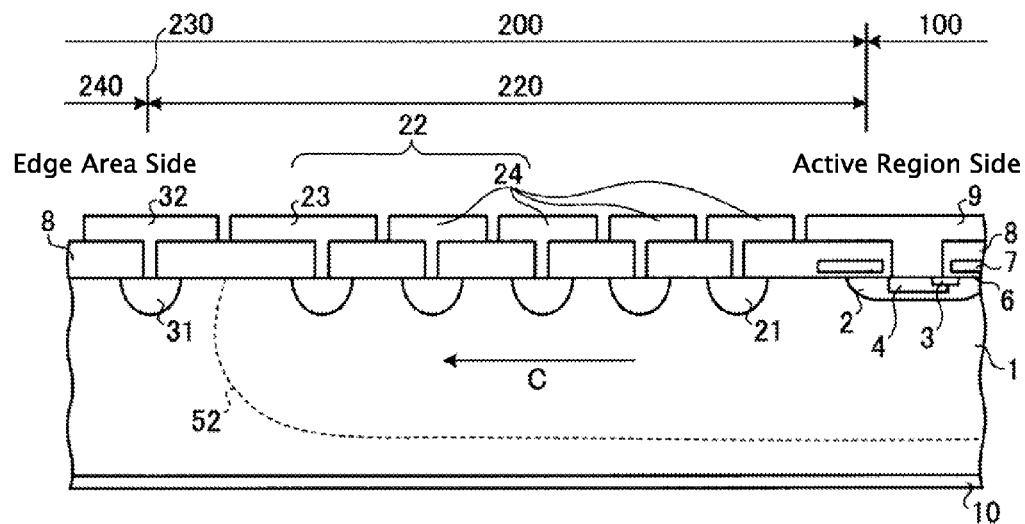
FIG. 7 is a cross sectional view illustrating the depletion layer extension at a forward voltage application in the reverse blocking IGBT according to the third embodiment.

FIG. 7 is a cross sectional view illustrating the depletion layer extension at a forward voltage application in the reverse blocking IGBT according to the third embodiment.

At the forward voltage application, depletion layer 52 extends in forward breakdown withstanding region 220 from channel region 2 in active region 100 and expands in the direction indicated by the arrow C from channel region 2 in the active region 100 to channel stopper region 31 in the drift region 1 surface portion. As depletion layer 52 extending from channel region 2 reaches inner FLR 21 in contact with second inner FP 24, second inner FP 24 is fixed at a high potential. Therefore, depletion layer 52 is pushed back toward active region 100 in drift region 1 below second inner FPs 24. Therefore, the depletion layer 52 extension is suppressed such that the depletion layer 52 extension is moderated as compared with the depletion layer extension in the conventional forward breakdown withstanding region. The reason for this is the same with the reason for the depletion layer extension suppression according to the first embodiment.

As described above, the inner FP (the first inner FP) in contact with the inner FLR nearest to the edge area is projected toward the edge area and the inner FPs (the second inner FPs) in contact with the inner FLRs excluding the inner FLR nearest to the edge area are projected toward the active region according to the third embodiment. By the inner FP extensions described above, the depletion layer extending at the forward voltage application from the channel region in the active region toward the edge area is suppressed as effectively as according to the first embodiment.

Therefore, the depletion layer expanding from the channel region is prevented from extending too far and the electric field strength in the vicinity of the channel stopper region is prevented from rising. By these mechanisms, the reverse blocking IGBT according to the third embodiment facilitates improving the forward withstand voltage more effectively than the conventional reverse blocking IGBT. The reverse blocking IGBT according to the third embodiment facilitates shortening the forward breakdown withstanding region by the width corresponding to the improvement on the forward withstand voltage and, therefore, shortening the breakdown withstanding region width.

Since the reverse blocking IGBT according to the third embodiment facilitates improving the reverse withstand voltage and shortening the reverse breakdown withstanding region width in the same manner as the reverse blocking IGBT according to the first embodiment, the reverse blocking IGBT according to the third embodiment facilitates further shortening the breakdown withstanding region width. Therefore, the reverse blocking IGBT according to the third embodiment facilitates reducing the area thereof.

(Fourth Embodiment)

Figure 8:
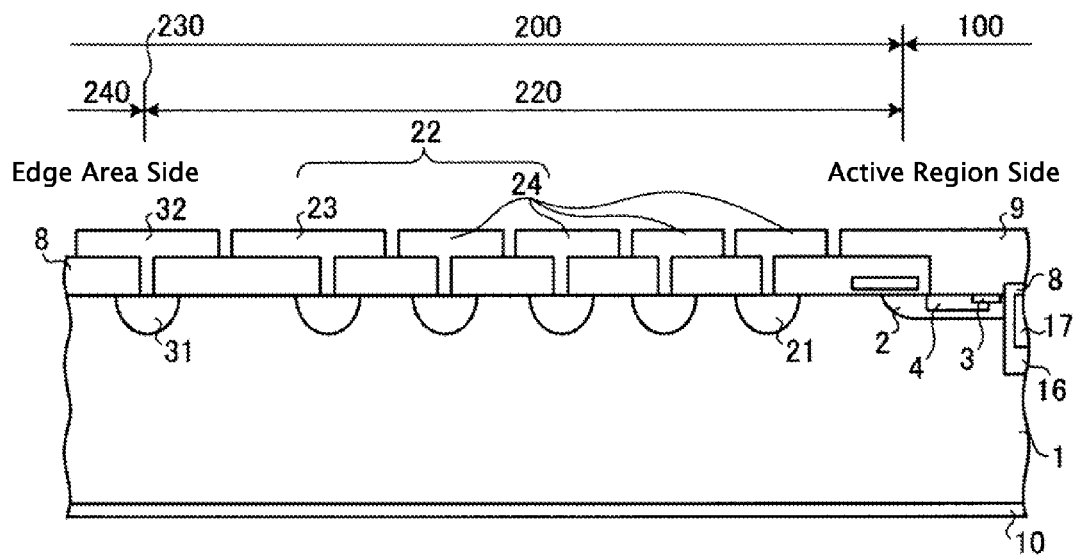
FIG. 8 is a cross sectional view showing the breakdown-withstanding junction edge-termination region in a reverse blocking IGBT according to a fourth embodiment of the invention.

FIG. 8 is a cross sectional view showing the breakdown-withstanding junction edge-termination region in a reverse blocking IGBT according to a fourth embodiment of the invention.

As shown in FIG. 8, active region 100 in the reverse blocking IGBT according to the third embodiment (cf. FIG. 6) may be provided with a trench-gate structure with no problem.

As shown in FIG. 8, gate electrode 17 is formed in the trench, formed to be deeper than channel region 2, with gate insulator film 16 interposed between gate electrode 17 and the trench inner wall in active region 100 in the reverse blocking IGBT according to the fourth embodiment. Gate electrode 17 is insulated from emitter electrode 9 by interlayer insulator film 8. The forward breakdown withstanding region 220 structure in the reverse blocking IGBT according to the fourth embodiment is the same with the forward breakdown withstanding region 220 structure in the reverse blocking IGBT according to the third embodiment. The reverse breakdown withstanding region 240 structure in the reverse blocking IGBT according to the fourth embodiment may be the same with the reverse breakdown withstanding region 240 structure in the reverse blocking IGBTs according to the first and second embodiments with no problem.

The reverse blocking IGBT according to the fourth embodiment exhibits the effects the same with the effects, which the reverse blocking IGBTs according to the first through third embodiments exhibit.

(Fifth Embodiment)

Figure 9:
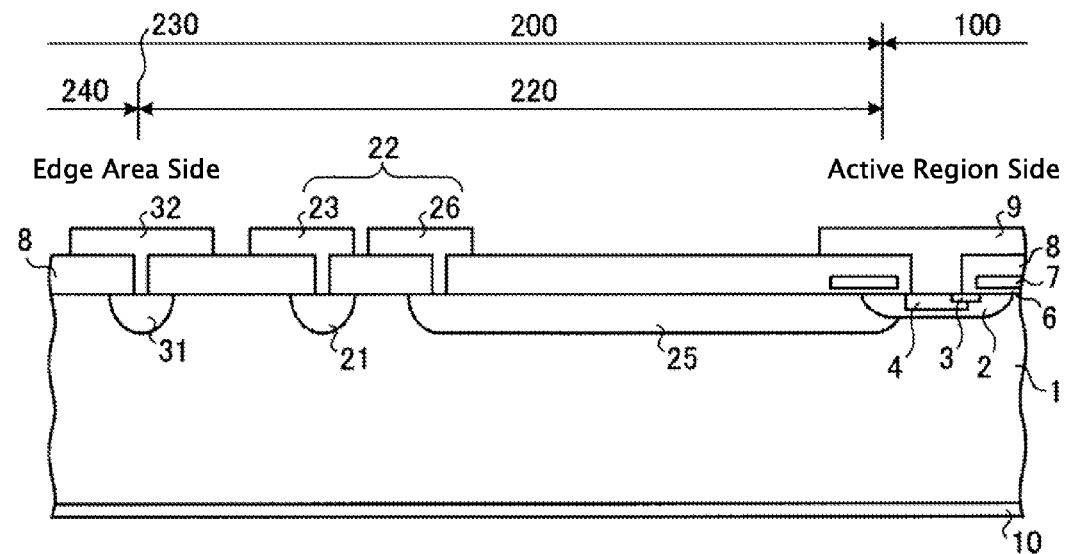
FIG. 9 is a cross sectional view showing the breakdown-withstanding junction edge-termination region in a reverse blocking IGBT according to a fifth embodiment of the invention.
Figure 10:
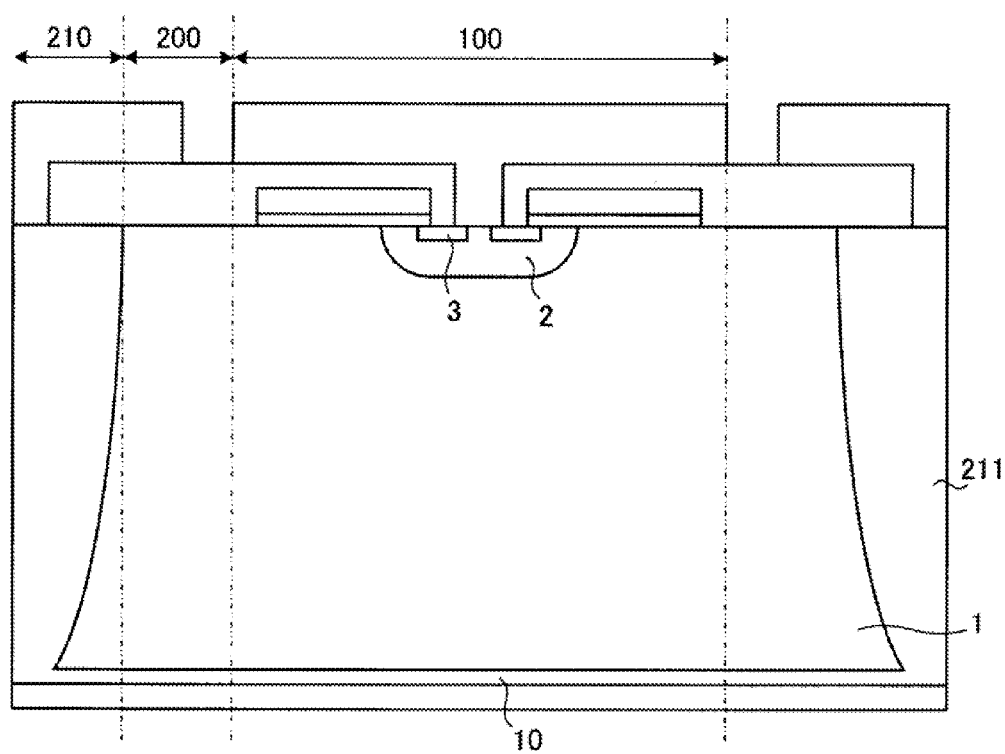
FIG. 10 is the cross sectional view of a conventional reverse blocking IGBT.

FIG. 9 is a cross sectional view showing the breakdown-withstanding junction edge-termination region in a reverse blocking IGBT according to a fifth embodiment of the invention.

As shown in FIG. 9, a p-type region doped more lightly than the drift region and having a reduced surface field structure (hereinafter referred to as a "RESURF structure") may be formed with no problem in substitution for the second inner PFs and the inner FLRs in contact with the second inner PFs in the reverse blocking IGBT according to the third embodiment (cf. FIG. 6). (Hereinafter the lightly doped p-type region will be referred to as the "RESURF region".)

As shown in FIG. 9, p-type RESURF region 25 is formed in the surface portion on the drift region 1 front side in forward breakdown withstanding region 220 such that p-type RESURF region 25 is surrounding active region 100. RESURF region 25 is doped more lightly than drift region 1. In the surface portion on the drift region 1 front side, inner FLR 21 is formed between RESURF region 25 and channel stopper region 31 such that inner FLR 21 is spaced apart from RESURF region 25 and channel stopper region 31.

The drift region 1 front surface, under which neither inner FLR 21 nor RESURF region 25 is formed, is covered with interlayer insulator film 8. Field plate (hereinafter referred to as "inner FP") 22 is formed on interlayer insulator film 8 on inner FLR 21 and RESURF region 25. Inner FP 22 includes first inner FP 23 and field plate (hereinafter referred to as "RESURF FP") 26. First inner FP 23 is in contact with and connected electrically to inner FLR 21. RESURF FP 26 is in contact with and connected electrically to RESURF region 25.

RESURF FP 26 is formed such that the edge portion thereof on the edge area side projects toward the edge area. In other words, the RESURF FP 26 edge portion on the edge area side is positioned more closely to the edge area than the RESURF region 25 edge portion on the edge area side. The first inner FP 23 structure according to the fifth embodiment is the same with the first inner FP structure according to the third embodiment. A plurality of first inner FPs 23 may be formed with no problem. The other structures according to the fifth embodiment are the same with the other structures according to the third embodiment. The inner FP 22 disposition according to the fifth embodiment exhibits the effects the same with the effects, which the inner FP disposition according to the third embodiment exhibits.

By disposing RESURF region 25 at the desired impurity concentration and at the desired junction depth, the depletion layer extending from the active region is made to be easier to extend toward the edge area. Therefore, before the electric field strength inside the semiconductor device rises high enough to breakdown the semiconductor device, the depletion layer extending from collector region 10 reaches the drift region 1 surface and depletes RESURF region 25. Therefore, the depletion layer extending from the active region toward the edge area is expanded. By the deletion layer expansion, the electric field is relaxed and the forward withstand voltage is improved.

As described above, the reverse blocking IGBT according to the fifth embodiment exhibits the effects the same with the effects, which the reverse blocking IGBTs according to the first through third embodiments exhibit.

Although the invention has been descried above in connection with the first through fifth embodiments, changes and modifications are obvious to the persons skilled in the art. For example, the active regions, the forward breakdown withstanding regions and the reverse breakdown withstanding regions according to the embodiments may be combined appropriately to constitute a reverse blocking IGBT. The conductivity types (the n-type and the p-type) may be reversed.

As described above, the semiconductor device according to the invention is used preferably for a switch, used in a matrix converter and such a series converter circuit, that is required to exhibit certain withstand voltages in the forward and reverse directions. Other uses of the invention, however, are also contemplated.

What is claimed is:

1. A semiconductor device comprising:
   a semiconductor substrate comprising a first semiconductor region of a first conductivity type;
   an active region in the semiconductor substrate;
   a breakdown withstanding region outside the active region;
   a collector region of a second conductivity type on a back surface of the semiconductor substrate;
   a second semiconductor region of the second conductivity type in a peripheral area of the breakdown withstanding region, the second semiconductor region being formed through the semiconductor substrate from a front surface thereof to the back surface thereof, the second semiconductor region being in contact with the collector region;
   a third semiconductor region of the second conductivity type in a surface portion of the breakdown withstanding region on a front side of the semiconductor substrate, the third semiconductor region surrounding the active region;
   an interlayer insulator film formed selectively on the front surface of the semiconductor substrate;
   a plurality of electrically conductive film portions in contact with the third semiconductor region, the plurality of electrically conductive film portions being on the interlayer insulator film;
   one or more of the plurality of the electrically conductive film portions, excluding at least an electrically conductive film portion in contact with a farthest third semiconductor region, which a depletion layer extending from the second semiconductor region toward the active region reaches, the farthest third semiconductor region being spaced apart most widely from the second semiconductor region, comprising a second semiconductor region side edge portion projecting farther toward the second semiconductor region than a second semiconductor region side edge portion of the third semiconductor regions in contact with the respective one or more of the plurality of electrically conductive film portions;
   a fourth semiconductor region of the second conductivity type in a surface portion of the breakdown withstanding region on the front side of the semiconductor substrate, the fourth semiconductor region suppressing an expansion of the depletion layer extending from the second semiconductor region toward the active region at a reverse voltage application; and
   the one or more of the plurality of electrically conductive film portions, in contact with the third semiconductor regions between the second semiconductor region and the fourth semiconductor region and excluding at least the electrically conductive film portion in contact with the farthest third semiconductor region, which the depletion layer extending from the second semiconductor region toward the fourth semiconductor region reaches, the farthest third semiconductor region being spaced apart most widely from the second semiconductor region, comprising a second semiconductor region side edge portion projecting farther toward the second semiconductor region than the second semiconductor region side edge portion of the third semiconductor regions in contact with respective one or more of the plurality of electrically conductive film portions.

2. The semiconductor device according to claim 1, wherein the number of the plurality of electrically conductive film portions comprising the second semiconductor region side edge portion projecting farther toward the second semiconductor region than the second semiconductor region side edge portion of the third semiconductor region is larger than the number of the plurality of electrically conductive film portions comprising a fourth semiconductor region side edge portion projecting farther toward the fourth semiconductor region than the fourth semiconductor region side edge portion of the third semiconductor region.

3. The semiconductor apparatus according to claim 2, wherein the number of the plurality of electrically conductive film portions comprising the fourth semiconductor region side edge portion projecting farther toward the fourth semiconductor region than the fourth semiconductor region side edge portion of the third semiconductor region is 1.

4. The semiconductor apparatus according to claim 3, wherein the semiconductor substrate is irradiated with an electron beam at a dose of 20 kGy or higher and treated thermally after lattice defects are introduced thereto.

5. The semiconductor apparatus according to claim 1, wherein the semiconductor substrate is irradiated with an electron beam at a dose of 20 kGy or higher and treated thermally after lattice defects are introduced thereto.

6. The semiconductor apparatus according to claim 1, wherein the adjacent third semiconductor regions are spaced apart more widely from each other as the third semiconductor regions are spaced apart more widely from the second semiconductor region.

7. The semiconductor apparatus according to claim 4, wherein the adjacent third semiconductor regions are spaced apart more widely from each other as the third semiconductor regions are spaced apart more widely from the second semiconductor region.

* * * * *